United States Patent [19]
Quan

[11] 4,297,620
[45] Oct. 27, 1981

[54] QUASI FEEDBACK HORIZONTAL SCAN LINEARIZATION FOR CATHODE RAY TUBES

[75] Inventor: Ronald Quan, Cupertino, Calif.

[73] Assignee: Ampex Corporation, Redwood City, Calif.

[21] Appl. No.: 129,059

[22] Filed: Mar. 10, 1980

[51] Int. Cl.³ .............................................. H01J 29/72
[52] U.S. Cl. ............................. 315/389; H01J/29/70
[58] Field of Search ............................... 315/387, 389

[56] References Cited
U.S. PATENT DOCUMENTS
3,725,726 4/1973 West ................................ 315/389
3,991,345 11/1976 Jaspers ............................ 315/389

*Primary Examiner*—Theodore M. Blum
*Attorney, Agent, or Firm*—George B. Almeida; Joel D. Talcott

[57] ABSTRACT

A horizontal scan linearization circuit generates a linear ramp voltage during the active picture scan interval, which is compared to the non-linear ramp current of a cathode ray tube yoke circuit. The difference signal is fed back to the yoke circuit via a damper diode and is selectively added to the non-linear yoke current to correct the non-linearity.

5 Claims, 2 Drawing Figures

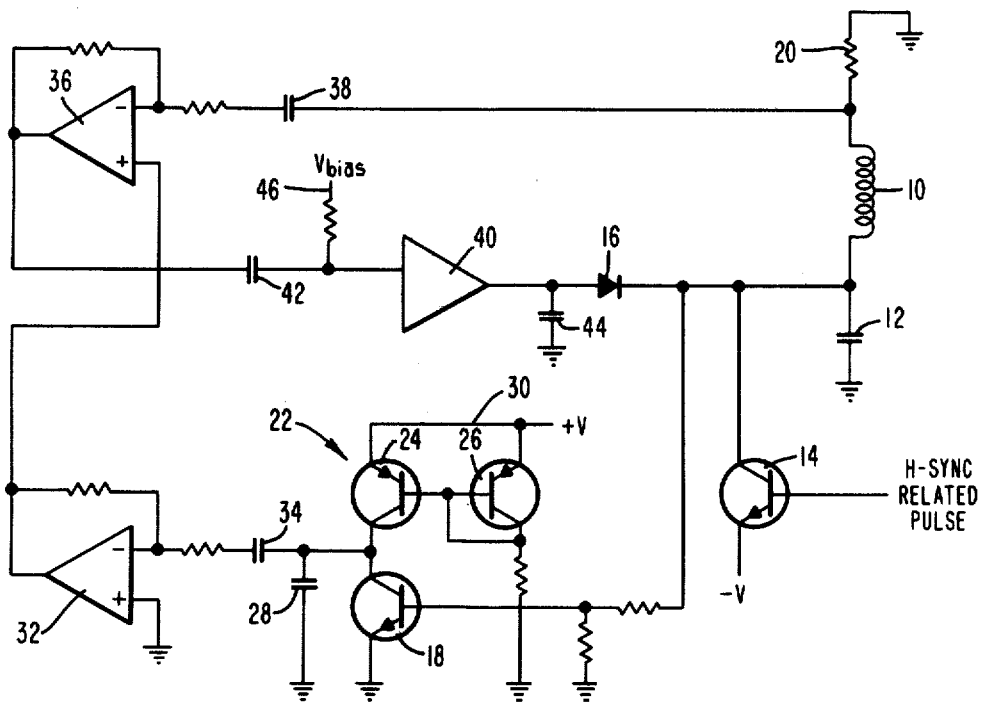
FIG_1
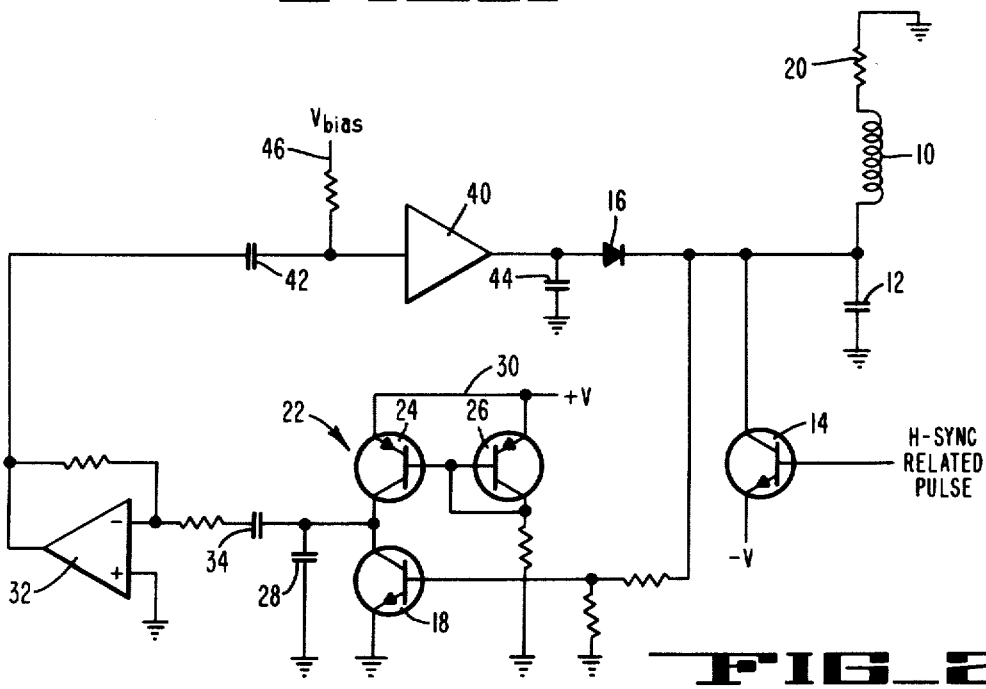
FIG_2

QUASI FEEDBACK HORIZONTAL SCAN LINEARIZATION FOR CATHODE RAY TUBES

BACKGROUND OF THE INVENTION

The invention relates to a horizontal scan linearizing circuit for use with cathode ray tube (CRT) yokes such as those employed in video camera viewfinders.

To provide horizontal scanning in a CRT via a control the yoke, a ramp current is applied to yoke during the active scan line interval of the video signal. However, the ramp current in the yoke is non-linear due to the resistive losses in the yoke and in the associated drive circuitry. It is desirable that this non-linearity be corrected.

Prior art linearizing schemes typically employ linearizing inductors with adjustable magnets, in series with the inductor which forms the yoke, or employ a technique using linear current driving yokes, to correct the scan non-linearity. However, the linear current driving yoke technique is somewhat inefficient for viewfinder applications. On the other hand, the inductors of the inductor technique are relatively large and bulky. Since it is a well known fact that size and weight are critical parameters in the design of color cameras, particularly in portable camera systems wherein power is supplied by a battery pack, the inductor technique is somewhat impractical for use in lightweight, i.e., portable, camera apparatus.

SUMMARY OF THE INVENTION

The invention provides a switching type of scan linearization circuit which overcomes the above-mentioned disadvantages of the prior art in achieving improved horizontal scan linearity with good efficiency, while eliminating the use of bulky, heavy inductors.

To this end, the yoke inductor of a viewfinder CRT, in combination with a switching transistor, generates a reset pulse during the flyback interval, which resets a ramp generator to zero to initiate a linear ramp voltage. A small sense resistor in series with the yoke converts the non-linear yoke current into a non-linear ramp voltage. A differential amplifier compares the signal which, in turn, is fed back to the yoke circuitry via a damper diode to selectively linearize the yoke current during the active video scan interval. In an alternate embodiment, the linear ramp voltage is fed back directly to the yoke circuitry, without making a comparison or generating a difference signal.

BRIEF DESCRIPTION OF THE DRAWINGS

FIG. 1 is a schematic diagram exemplifying an embodiment of a horizontal scan linearization circuit.

FIG. 2 is a schematic diagram of an alternative embodiment of circuit of FIG. 1.

DESCRIPTION OF THE PREFERRED EMBODIMENTS

In FIG. 1 a horizontal scan circuit includes a yoke 10 formed of an inductor, and is employed to generate the horizontal scan process in a cathode ray tube (CRT) of a video camera viewfinder apparatus (not shown). The horizontal scan circuit includes one end of the yoke coupled to ground via a resonating capacitor 12, to the collector of a switching transistor 14 and to the cathode of a damper diode 16. The latter diode starts the scan after a maximum reverse current appears on the yoke 10. The base of the transistor 14 is coupled to a horizontal sync related driving pulse derived, for example, from a horizontal oscillator (not shown). The emitter thereof is coupled to a negative voltage source corresponding to the conventional horizontal scan ramp voltage on resistor 20.

In the scan linearizer circuit, the yoke 10 is also coupled to the base of a reset transistor 18, while the opposite end of the yoke is coupled to ground via a small sense resistor 20. The emitter of transistor 18 is coupled to ground, and the collector thereof to a ramp generator 22 formed of a pair of transistors 24, 26, a capacitor 28 and a positive voltage source 30. The ramp generator 22 i.e., the capacitor 28, is AC coupled to an inverting amplifier 32, via a coupling capacitor 34, and thence to the positive input of a differential amplifier 36. The negative input of the latter is coupled via a resistance and a coupling capacitor 38, to the junction between the resistor 20 and the yoke 10. The output of the differential amplifier 36 is AC coupled to an emitter follower 40 via a coupling capacitor 42, and thence to the anode of the diode 16. The latter anode is partly coupled to ground via a capacitor 44, which removes high frequency spurious signals but not the scan correction error voltage. A bias voltage 46 is applied to the emitter to follower 40 input, to match the turn-on voltage of the switching transistor 14 with that of the damper diode 16.

Thus, in operation, the switching transistor 14 is enabled in response to the H-sync related input pulse, to generate a ramp current in conjunction with the yoke 10. However, the ramp current waveform is non-linear due to resistive losses in the yoke 10 and in the transistor 14.

To correct the non-linearities, the sense resistor 20 converts the non-linear yoke current into a non-linear ramp voltage and feeds it to the differential amplifier 36. During the flyback interval, the sharp pulse generated via the yoke 10 inductance, is fed to the reset transistor 18, which turns on to reset the linear ramp voltage across the capacitor 28. The linear ramp voltage is inverted via inverting amplifier 32 and is fed to the differential amplifier 36. The latter generates a difference signal by comparing the non-linear ramp voltage from the resistor 20 and the linear voltage from the ramp generator 22. The difference signal is fed back to the yoke horizontal scan circuit via the emitter follower 40 and the damper diode 16. The emitter follower provides impedance matching and the output thereof is the difference signal added to the bias voltage 46. The combination signal is fed to the yoke 10 to linearize the yoke current and thus correct for non-linearities in the horizontal scan of the associated CRT. The gain of the differential amplifier 36 and the amplitude of the linear ramp voltage are adjusted to provide the optimum horizontal linearity.

The linearizing circuit of FIG. 1, provides the linearizing correction waveform to the yoke circuit via the diode 16 during substantially the first half of the active scan interval, when the switching transistor 14 is turned off. At such time, the resonating capacitor 12 rings the yoke current negative, i.e., the energy in the yoke is dumped into the capacitor 12 causing oscillation and negative current flow in the yoke 10. When the transistor 14 is turned on via the H sync related input pulse during substantially the second half of the active scan interval (about 40 msec before the end of the active video line), the linearizing circuit is essentially disabled and the horizontal scan circuit operates in generally conventional manner. However, the cumulative affect of employing the linearizing process over substantially half of the active scan, is to provide decidedly improved scan linearity with relatively simple and lightweight circuitry.

FIG. 2 depicts a simplification of the combination of FIG. 1, wherein the differential voltage amplifier 36 is deleted, and the inverted linear ramp voltage from the generator 22 and the inverting amplifier 32 is fed to the yoke circuit via the feedback path of the damper diode 16, the emitter follower 40, etc. Thus non-linearities in the scan are substantially corrected by applying the inverted linear ramp voltage with the bias voltage 46, to the yoke circuit via the damper diode. The circuit of FIG. 2 offers additional simplification for application wherein circuit simplicity and minimum size are paramount considerations.

What is claimed is:

1. A scan circuit for linearizing the non-linear yoke current during the horizontal scan interval of a horizontal scan circuit including a yoke and serial switching transistor, comprising the combination of;
   a current sensing resistor in series with the yoke for generating a non-linear voltage ramp commensurate with the non-linear yoke current;
   a resonating capacitor coupled to the yoke oppsoite the sensing resistor;
   linear ramp generator means coupled to the yoke opposite the sensing resistor and including a holding capacitor and transistor means coupled thereto, wherein the ramp generator means generates a linear voltage ramp in response to a reset pulse due to the yoke inductance during the flyback interval of the horizontal scan; and
   feedback means including the ramp generator means and a damper diode coupled to the yoke opposite the sensing resistor for selectively feeding back the linear voltage ramp to the yoke circuit during the first half of a selected line scan interval to linearize the corresponding non-linear yoke current.

2. The circuit of claim 4 wherein the feedback means further includes;
   differential voltage amplifier means coupled from the linear ramp generator means to the damper diode for generating a difference signal between the non-linear voltage ramp and the linear voltage ramp; and
   wherein the damper diode selectively feeds back the difference signal to the yoke circuit.

3. The circuit of 2 further including;
   emitter follower means operatively coupled between the differential amplifier and the damper diode, and including a bias voltage for matching the turn-on voltages of the switching transistor and the damper diode; and
   wherein the damper diode is coupled to the yoke circuit to feed back the composite difference signal and bias voltage signal.

4. The circuit of claim 1 wherein;
   the resonating capacitor rings the yoke current negative during the linearizing process corresponding to the first half of the selected line scan; and
   the feedback means is disabled during the second half of the line scan in response to the switching transistor.

5. The circuit of claim 4 wherein the feedback means further includes;
   emitter follower means operatively coupled between the linear ramp generator means and the damper diode, and including a bias voltage coupled to the input thereof; and
   wherein the damper diode feeds back the composite linear ramp voltage and bias voltage signals.

* * * * *